(12) United States Patent
Suzuki

(10) Patent No.: US 8,164,872 B2
(45) Date of Patent: Apr. 24, 2012

(54) POWER SUPPLY CLAMP CIRCUIT

(75) Inventor: Teruo Suzuki, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 255 days.

(21) Appl. No.: 12/707,275

(22) Filed: Feb. 17, 2010

(65) Prior Publication Data

US 2010/0246079 A1    Sep. 30, 2010

(30) Foreign Application Priority Data

Mar. 31, 2009    (JP) .................................. 2009-87519

(51) Int. Cl.
*H01L 23/62*    (2006.01)
(52) U.S. Cl. .......................................... 361/56; 257/355
(58) Field of Classification Search .................... 361/56, 361/111; 257/355–360
See application file for complete search history.

(56) References Cited

U.S. PATENT DOCUMENTS

| 7,064,392 B1* | 6/2006 | Morishita ...................... 257/360 |
| 7,476,941 B2* | 1/2009 | Shima et al. ................... 257/357 |
| 2005/0180076 A1 | 8/2005 | Saito et al. |
| 2006/0232318 A1 | 10/2006 | Iwahori et al. |

FOREIGN PATENT DOCUMENTS

| JP | 2005-235947 A | 9/2005 |
| JP | 2006-302971 A | 11/2006 |

* cited by examiner

*Primary Examiner* — Danny Nguyen
(74) *Attorney, Agent, or Firm* — Arent Fox LLP

(57) ABSTRACT

A power supply clamp circuit includes a first transistor including a metal silicide layer that is formed in a substrate between a first electrode coupling part in a first drain region and a first gate electrode, and a second transistor including a first metal silicide layer and a second metal silicide layer each of which is formed in a substrate between a second electrode coupling part in a second drain region and a second gate electrode, wherein the first metal silicide layer and the second metal silicide layer are spaced apart from each other.

10 Claims, 12 Drawing Sheets

US 8,164,872 B2

POWER SUPPLY CLAMP CIRCUIT

CROSS-REFERENCE TO RELATED APPLICATION

This application is based upon and claims the benefit of priorities of the prior Japanese Patent Application No. 2009-87519, filed on Mar. 31, 2009, the entire contents of which are incorporated herein by reference.

FIELD

The present disclosure relates to a power supply clamp circuit.

BACKGROUND

A semiconductor integrated circuit includes an electrostatic discharge (ESD) protection circuit for preventing destruction of an internal circuit due to ESD. An ESD is often generated from a human body during an assembly process of a semiconductor integrated circuit and a mounting process of a semiconductor circuit on a printed circuit board. Thus, it is necessary that a semiconductor integrated circuit includes a protection circuit that protects internal circuit elements from a high voltage surge due to ESD applied to an external terminal while powered off.

For example, Japanese Laid-open Patent Publication No. 2005-235947 and No. 2006-302971 discuss ESD protection circuits.

Japanese Laid-open Patent Publication No. 2005-235947 discusses protection of an internal circuit from a high voltage surge due to ESD by a transistor that temporarily turns on and increases a gate potential of a clamp transistor to turn on a bipolar transistor of a clamp transistor. Japanese Laid-open Patent Publication No. 2006-302971 discusses a power supply clamp circuit that is not turned on at an allowable level of power supply noise under normal operation.

As described above, various kinds of protection circuits that protect internal circuit elements from ESD have been proposed. However, ESD protection circuits are designed under assumption that all input and output terminals are at ground potential with power not supplied to an integrated circuit.

A latch-up test of Capacitance-Voltage (C-V) method for an in-car integrated circuit device is specified by the standard specifications that checks whether or not the integrated circuit device may protect an internal circuit element from a high-voltage surge of a power supply voltage that is generated with power on. In this latch-up test of C-V method, charges that generate a given high voltage surge to a power supply terminal and a signal terminal are applied with normal power supply being applied to an integrated circuit. It is assumed that a conventional ESD protection circuit operates under a condition that no power supply voltage is applied, and does not sufficiently protect an internal circuit from a high voltage surge which is applied to a power supply when the latch-up test of C-V method is executed.

SUMMARY

According to an aspect of the embodiments, a power supply clamp circuit includes a first transistor including a metal silicide layer that is formed in a substrate between a first electrode coupling part in a first drain region and a first gate electrode, and a second transistor including a first metal silicide layer and a second metal silicide layer each of which is formed in a substrate between a second electrode coupling part in a second drain region and a second gate electrode, wherein the first metal silicide layer and the second metal silicide layer are spaced apart from each other.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF THE EMBODIMENTS

Figure 1:
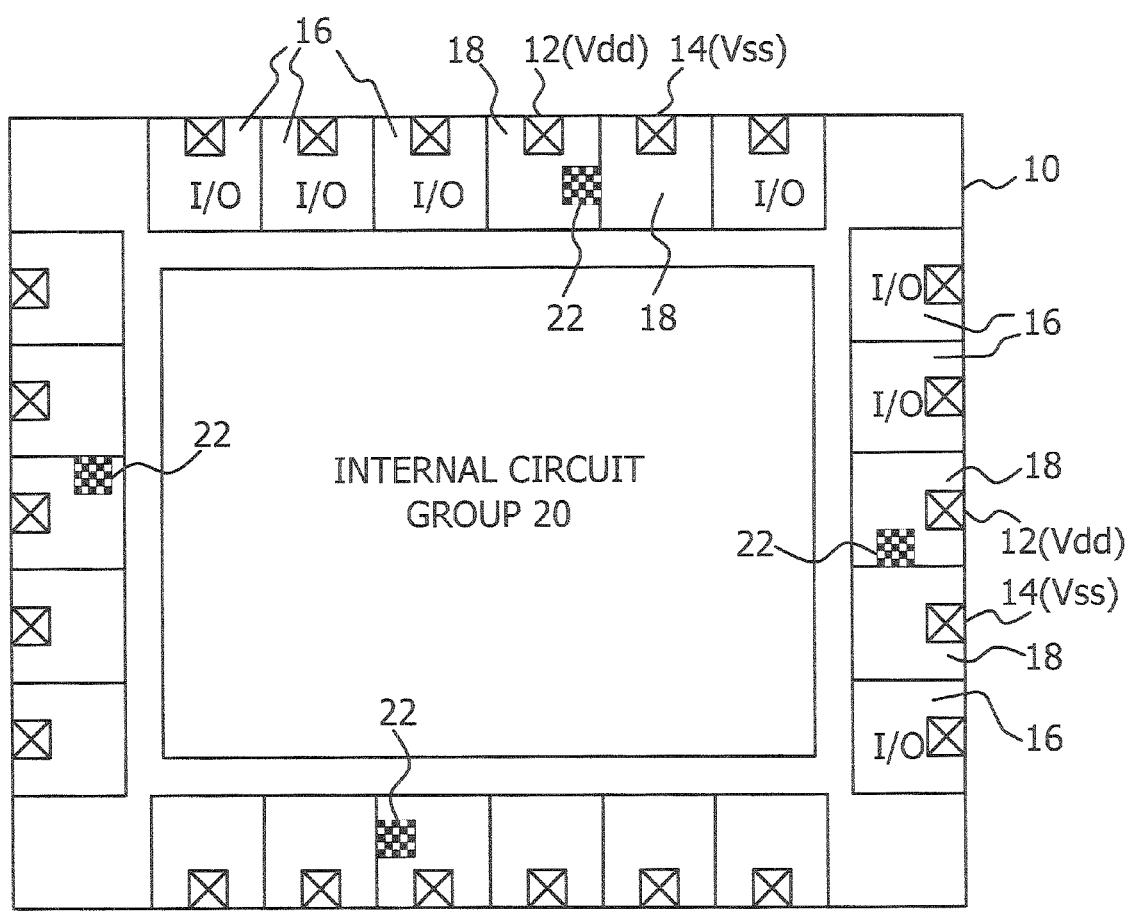
FIG. 1 illustrates an integrated circuit chip over which a power supply clamp circuit according to an embodiment is provided.

FIG. 1 is a schematic plain view of an integrated circuit chip over which a power supply clamp circuit according to this embodiment is provided. Power supply terminals 12 of first power supplies Vdd, power supply terminals 14 of second power supplies Vss (ground), and I/O terminals 16 are provided around a semiconductor substrate chip 10. I/O cells of input/output are provided at the position of the I/O terminals 16, and power supply cells 18 are provided at the positions of the power supply terminals 12 and 14. An internal circuit group 20 is provided at the center part of a chip substantially surrounded by the I/O cells and the power supply cells 18. A first power supply wiring (not illustrated) that is coupled to the power supply terminal 12 and a second power supply wiring (not illustrated) that is coupled to the power supply terminal 14 are disposed in the internal circuit group 20, and internal circuits are coupled to the first and the second power supply wirings. The internal circuit group 20 includes, for example, a large-scale circuit macro such as a memory or a processor, a logic cell group that makes up a sequential logic such as a resistor or a combinational circuit, and a signal wiring group that couples the large-scale circuit macro and the logic cell, for example.

A clamp transistor forming region 22 of a power supply clamp circuit is provided in the power supply cell 18. This power supply clamp circuit is a protection circuit that absorbs a large current from a wiring of the power supply Vdd toward a wiring of the power supply Vss when a high voltage surge is applied when the power supply Vdd is powered on and prevents the large current from flowing into the internal circuit group 20.

Moreover, the power supply clamp circuit according to this embodiment provides a function to prevent a large current from flowing into the internal circuit group 20 by temporarily becoming conductive when a high voltage surge due to ESD is generated with the power supply Vdd powered off and a potential difference between the power supply terminal 12 and the power supply terminal 14 becomes large.

Figure 2:
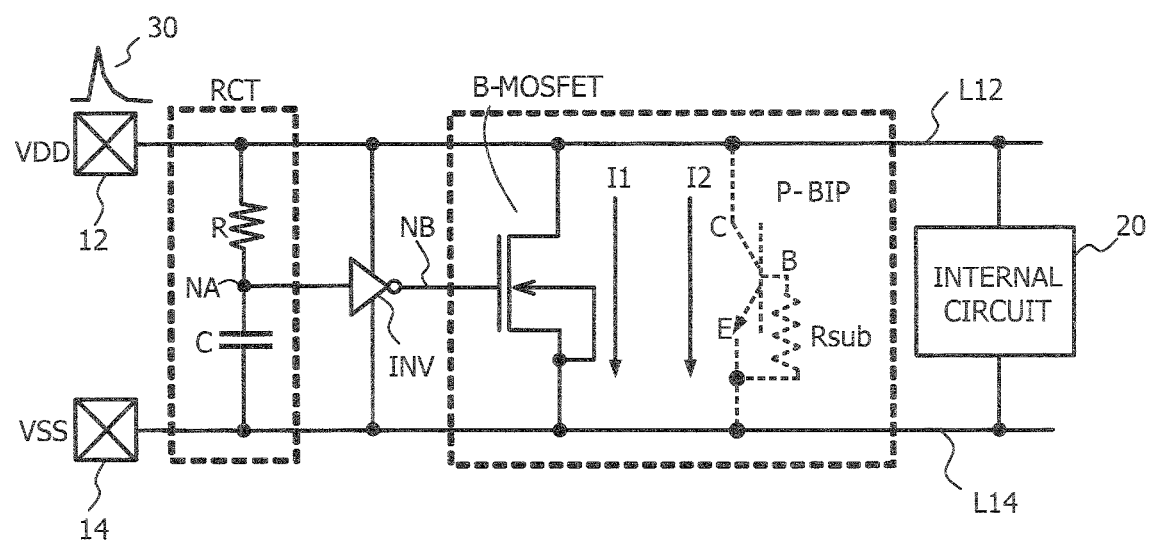
FIG. 2 illustrates the power supply clamp circuit illustrated in FIG. 1.

FIG. 2 is a circuit diagram of a power supply clamp circuit according to this embodiment. The power supply clamp circuit is provided between a first power supply wiring L12 that is coupled to the terminal 12 of the power supply Vdd and a second power supply wiring L14 that is coupled to the terminal 14 of the ground power supply VSS, and includes a clamp transistor B-MOSFET that is made up of a large area MOS transistor, a drain of which is coupled to the first power supply wiring L12, and a source of which is coupled to the second power supply wiring L14.

The power supply clamp circuit further includes a RC timer circuit RCT with a resistance R and a capacitance C serially coupled between the first power supply wiring L12 and the second power supply wiring L14, and also includes an inverter INV to which an output NA of the RC timer circuit RCT is input, and an output NB of the inverter INV is coupled to a gate of the clamp transistor B-MOSFET. The inverter INV is a CMOS inverter circuit that includes a P-channel MOS transistor, a source of which is coupled to the first power supply wiring L12, and an N-channel MOS transistor, a source of which is coupled to the second power supply wiring L14.

The clamp transistor B-MOSFET is an N-channel MOSFET that includes an N type drain and source regions in a P-type channel forming region (not illustrated), and a gate electrode that is provided between the drain and source regions. The drain region, the channel forming region, and the source region make up an NPN parasitic bipolar transistor P-BIP.

When a high voltage surge 30 due to ESD is applied while the power supply Vdd is not applied, the power supply clamp circuit absorbs the surge current by making an NMOS transistor B-MOSFET conductive. In other words, while the power supply Vdd is not applied, all of the I/O terminals, the power supply terminals, and the entire device are at ground level. For example, it is assumed that ESD is applied to the power supply terminal 12 and the ground terminal 14 is a reference terminal for the power supply terminal 12. The output node NA of the RC timer circuit RCT temporarily maintains a potential of the ground terminal 14. As a result, the output node NB of the inverter INV temporarily becomes an "H" level of the power supply voltage Vdd, making the NMOS transistor B-MOSFET conductive, thereby a large current that is a surge current I1 is absorbed. Therefore, a surge current does not flow into the internal circuit 20, and thereby reduces if not prevents destruction of electric elements in the internal circuit. When the output node NA of the RC timer circuit RCT becomes an "H" level, the output node NB of the inverter INV becomes an "L" level, and thereby the NMOS transistor B-MOSFET is turned off.

Under a normal condition in which the power supply Vdd is applied, the output node of the RC timer circuit RCT is constantly in an "H" level, thus, the output node NB of the inverter INV almost constantly becomes an "L" level, and the NMOS transistor B-MOSFET that is a clamp transistor maintains an off state, therefore normal operation of the internal circuit 20 is not disturbed.

An "on" operation of the NMOS transistor B-MOSFET in the power supply clamp circuit is not sufficient as described above when the high voltage surge 30 generated at the power supply Vdd is applied under an operation state in which the power supply VDD is applied. A surge current I2 is absorbed by making a parasitic bipolar transistor that is made up of the N-type drain, the P-type channel forming region, and the N-type source conductive. According to the operation principle, when a high voltage surge 30 is applied, a PN junction under a reverse bias state between a drain forming region and a channel forming region suffers a junction breakdown due to the high voltage based on the high voltage surge 30, and a potential of a base B becomes higher than a potential of an emitter E due to a substrate resistance Rsub where the breakdown current flows, thereby making the NPN parasitic bipolar transistor turn on and become conductive. The current I2 that is absorbed by the NPN parasitic bipolar transistor P-BIP is larger than the current I1 that flows on the substrate surface when the NMOS transistor B-MOSFET becomes conductive.

Figure 3:
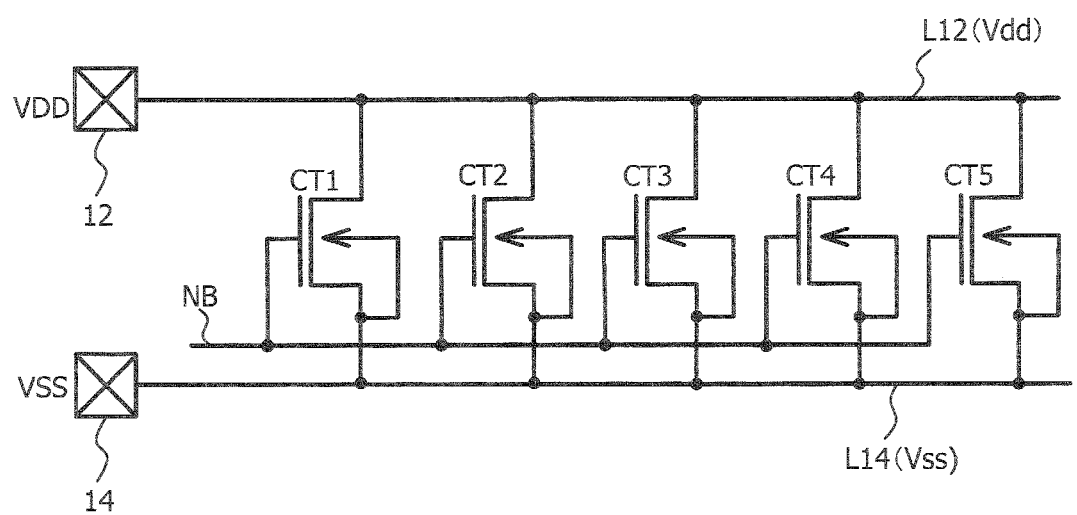
FIG. 3 illustrates a clamp transistor of the power supply clamp circuit illustrated in FIG. 1.

FIG. 3 is a circuit diagram of the clamp transistor of the power supply clamp circuit according to this embodiment. It is known that the wider a channel width is, the larger a driving current of a parasitic bipolar transistor of a MOS transistor becomes. However, it is known that the size of the driving current is saturated when the channel width exceeds a given size. For example, an "on" current per unit width conversely lowers when the channel width is 50 μm or more and the on current per unit width becomes larger when a channel width is approximately 20 to 30 μm.

Accordingly, the clamp transistor according to this embodiment is made up of a plurality of clamp transistor units CT1 to CT5 with a channel width of approximately 20 to 30 μm that are serially coupled between the wiring L12 of the first power supply Vdd and the wiring L14 of the second power supply Vss. For example, when a channel width of 3,200 μm is desired in order to absorb a surge current, 160 clamp transistors with a channel width of 20 μm are formed serially between power supply wirings. A desired amount of surge is made to flow by multi-finger turn-on (substantially simultaneous turn-on) of the 160 parasitic bipolar transistors. Substantially simultaneous turning on the plurality of parasitic bipolar transistors of clamp transistor units makes a large surge flow, thereby protects an internal circuit from destruction. If only some of the 160 parasitic bipolar transistors are turned on, excessive current flows into the transistors that are turned on and results in thermal destruction. Therefore, it is desirable that more parasitic bipolar transistors are substantially simultaneously turned on.

A clamp transistor illustrated in FIG. 3 includes a plurality of clamp transistor units CT1 to CT5 and the gates of the CT1 to CT5 are commonly coupled to the output node NB of the inverter INV illustrated in FIG. 2. Parasitic bipolar transistors are formed in the clamp transistor units CT1 to CT5 respectively.

Figure 4:
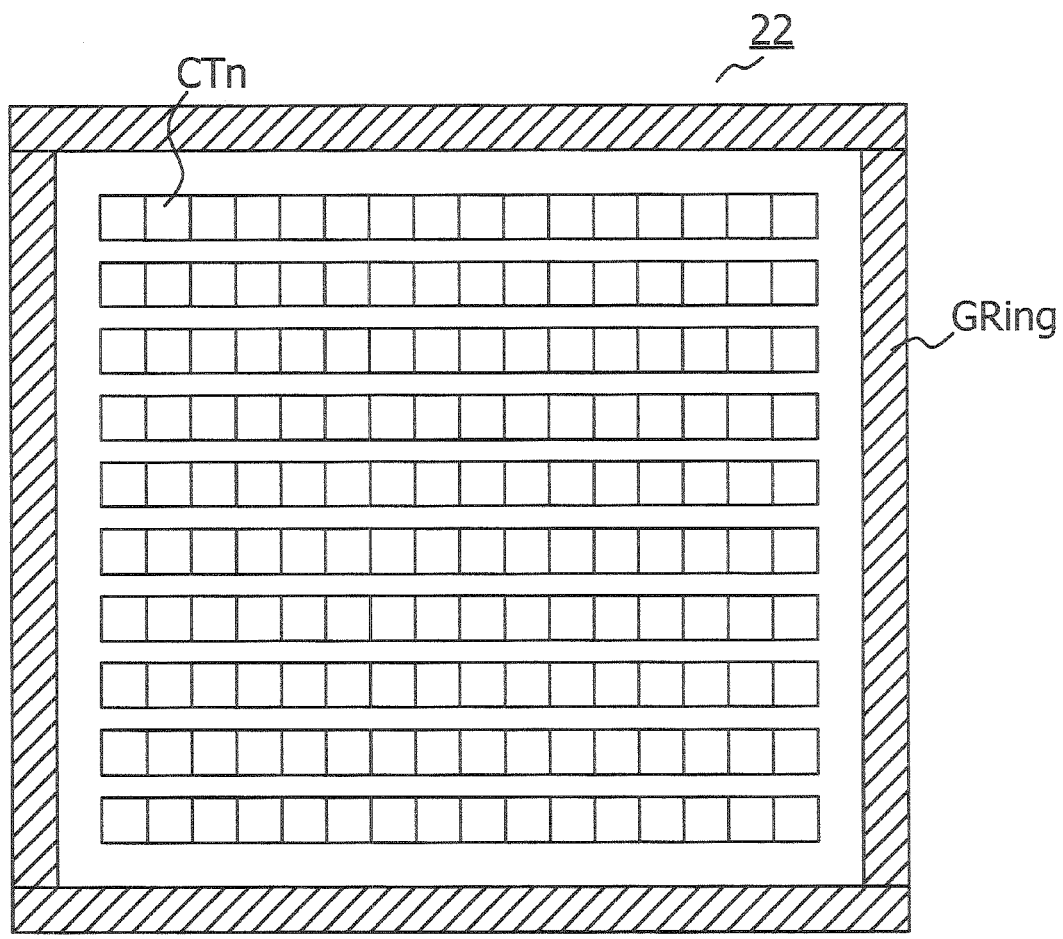
FIG. 4 is a plain view illustrating a group of clamp transistor units of the integrated circuit chip illustrated in FIG. 1.

FIG. 4 is a plain view of a clamp transistor unit group according to this embodiment. FIG. 4 illustrates the clamp transistor forming region 22 illustrated in FIG. 1. The clamp transistor forming region 22 is surrounded by a guard ring region GRing that couples a P-type substrate region to a ground, and 16×10=160 clamp transistor units CTn are formed in the clamp transistor forming region. The clamp transistor units CTn may be the clamp transistor units illustrated in FIG. 3. Gate electrodes of the 160 clamp transistor units are coupled to the output node NB of the inverter INV in FIG. 2. The drains of the 160 clamp transistor units are coupled to the wiring of the first power supply Vdd, while the sources of the 160 clamp transistor units are coupled to the wiring L14 of the second power supply Vss.

As illustrated in FIG. 2, each of the clamp transistor units CTn includes an NMOS transistor and the parasitic NPN bipolar transistor. The NMOS transistor becomes conductive when a high voltage surge due to, for example, ESD is applied while the power supply Vdd is not applied. The parasitic NPN bipolar transistor becomes conductive when a high voltage surge due to, for example, electric noise is applied with the power supply Vdd applied, and conducts the surge.

The plurality of clamp transistor units of the power supply clamp circuit according to this embodiment are configured by disposing the first MOS transistors (clamp transistors) with full silicide structures (not silicide blocks), and the second MOS transistors (clamp transistors) with silicide block structures in a distributed manner so that multi-finger turn-on is easily performed when a parasitic bipolar operation occurs.

Figure 5A:
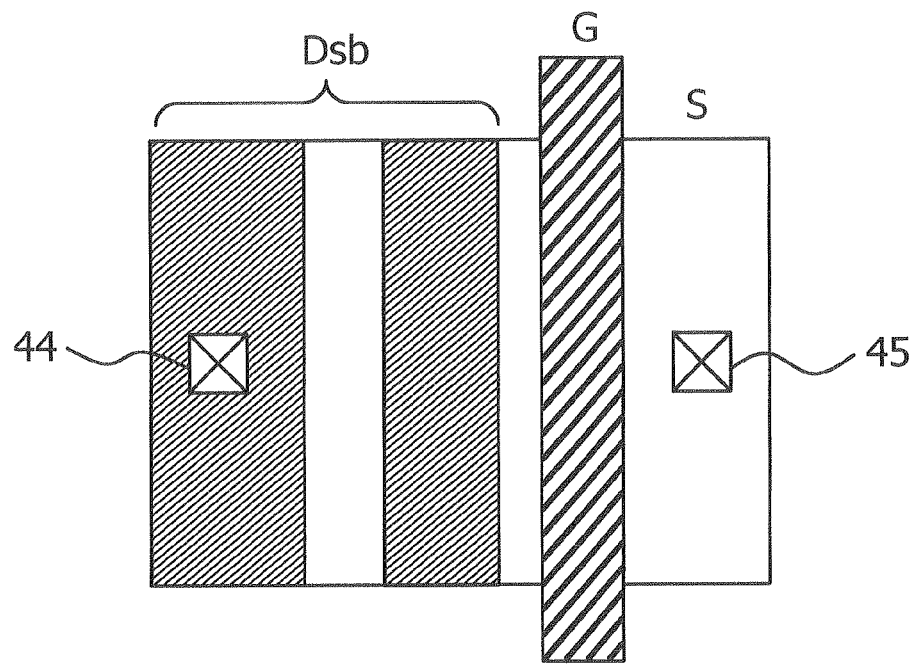
FIG. 5A illustrates a second clamp transistor.
Figure 5A:
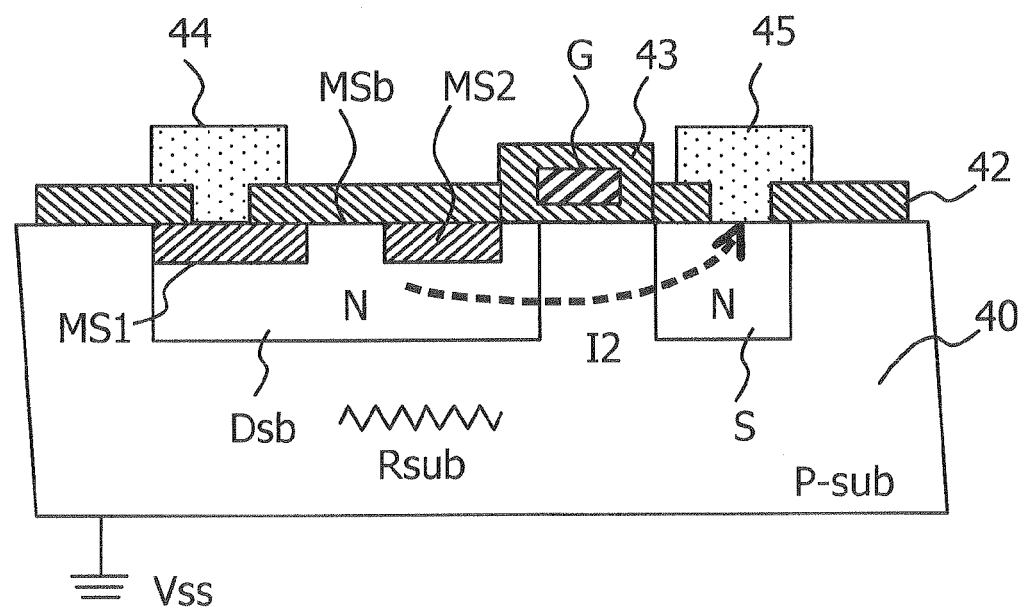
Figure 5B:
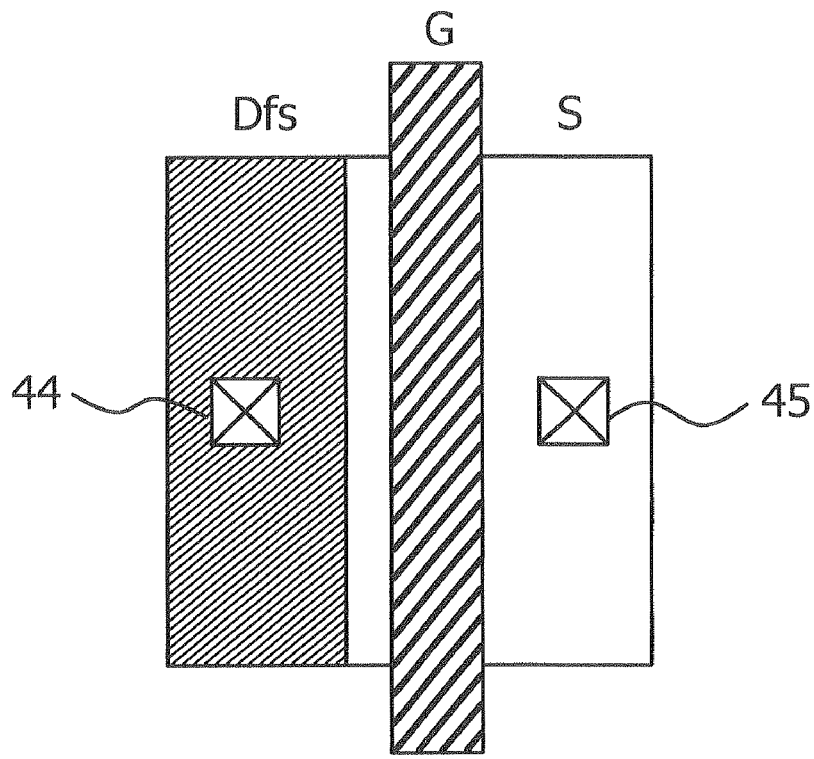
FIG. 5B illustrates a first clamp transistor.
Figure 5B:
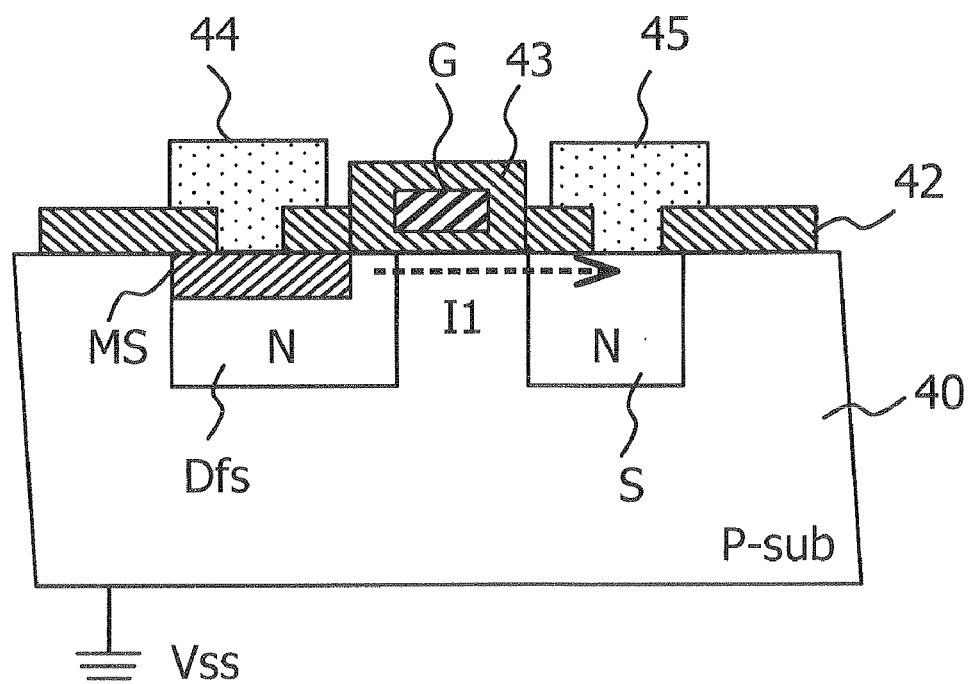

FIG. 5A illustrates a plain view and a sectional view of a second clamp transistor. FIG. 5B illustrates a plain view and a sectional view of a first clamp transistor. The first clamp transistor in FIG. 5B includes an N-type drain region Dfs and a source region S formed on a surface of a P-type silicon substrate 40, and a gate electrode G formed between the drain region Dfs and the source region S and surrounded by an insulating film 43. An upper region of the gate electrode G or a whole the gate electrode G may be silicided. An insulating film 42 with contact windows is formed over the drain region Dfs and the source region S. A drain electrode 44 is formed over the contact window of the drain region Dfs, and a source electrode 45 is formed over the contact window of the source region S. A silicide layer MS that includes a metal such as cobalt is formed on the surface of the substrate from a contact portion of the drain electrode 44 of the drain Dfs to the gate electrode G. A silicide layer that includes a metal such as cobalt may be formed on the surface of the substrate from a contact portion of the source electrode 45 of the drain Dfs to the gate electrode G. The silicide layer MS may decrease drain resistance.

The second clamp transistor in FIG. 5A includes an N-type drain region Dsb and a source region S formed in the surface of the P-type silicon substrate 40, and a gate electrode G formed between the drain region Dsb and the source region S and surrounded by an insulating film 43. An upper region of the gate electrode G or a whole the gate electrode G may be silicided. An insulating film 42 with contact windows is formed over the source region S and the drain region Dsb. A drain electrode 44 is formed over the contact window of the drain region Dsb while a source electrode 45 is formed over the contact window of the source region S. Silicide layers MS1 and MS2 that include a metal such as cobalt are formed over the surface of the substrate from a contact portion of the drain electrode 44 of the drain Dsb to the gate electrode G, and moreover, a silicide block region MSb in which no silicide layer is formed is formed between the silicide layers MS1 and MS2. A silicide layer that includes a metal such as cobalt may be formed on the surface of the substrate from a contact portion of the source electrode 45 of the drain Dfs to the gate electrode G.

The drain region Dsb includes the silicide block region MSb, thus the drain resistance becomes higher. Therefore, a multi-finger turn-on easily occurs when the parasitic NPN transistor, which is made up of the drain, a region of the substrate in which channels are formed, and the source, becomes conductive. Moreover, when a silicide block is provided, the route of current flow is an on-current I2 in FIG. 5A, and concentration of current near the gate as indicated by current I1 in FIG. 5B does not occur, thereby ESD withstanding voltage is improved.

As may be seen from the plain views of FIGS. 5A and 5B, even with the same channel width, the area of the second clamp transistor that includes the silicide block region MSb in the drain region Dsb is about two times larger than the area of the first clamp transistor with a full silicide configuration that provides a metal silicide region MS over the drain region. An alignment margin is desirable in order to form the silicide block region MSb.

According to the inventors of this disclosure, configuring a plurality of clamp transistor units in a power supply clamp circuit as the above described first clamp transistor (full silicide transistor) reduces the area of a clamp transistor forming region 22. However, in a C-V method latch-up test, parasitic bipolar transistors of a plurality of clamp transistors may not turn on together. Thus two kinds of cases may coexist, one case is that all the clamp transistors turn on together, and the other case is that only some of the clamp transistors turn on together. In other words, only some of the parasitic bipolar transistors turn on, and the remaining parasitic bipolar transistors do not turn on, thereby a surge current is concentrated on the few parasitic bipolar transistors that are turned on, and it was found that thermal destruction may be caused at a voltage lower than the design specification. This unstable multi-finger turn-on operation is inappropriate for a power supply clamp circuit even if, for example, the occupied area is reduced.

Configuring a plurality of clamp transistor units of a power supply clamp circuit like the above described second clamp transistors (a transistor with a silicide block) allows for stably turning on the parasitic bipolar transistors of all the plurality of clamp transistor units together in a C-V method latch-up test. However, the area of the clamp transistor forming region 22 becomes larger accordingly.

According to the inventors of this disclosure, it was found that disposing the first clamp transistors with small areas and the second clamp transistors with large areas in a distributed manner reduces the area that the first and the second clamp transistors occupy, and allows for stable substantially simultaneous turn-on. Moreover, it was found that the stability improves by adjacently disposing the second clamp transistors with large areas at the center area of the clamp transistor forming region which is the farthest from the guard ring region.

Figure 6:
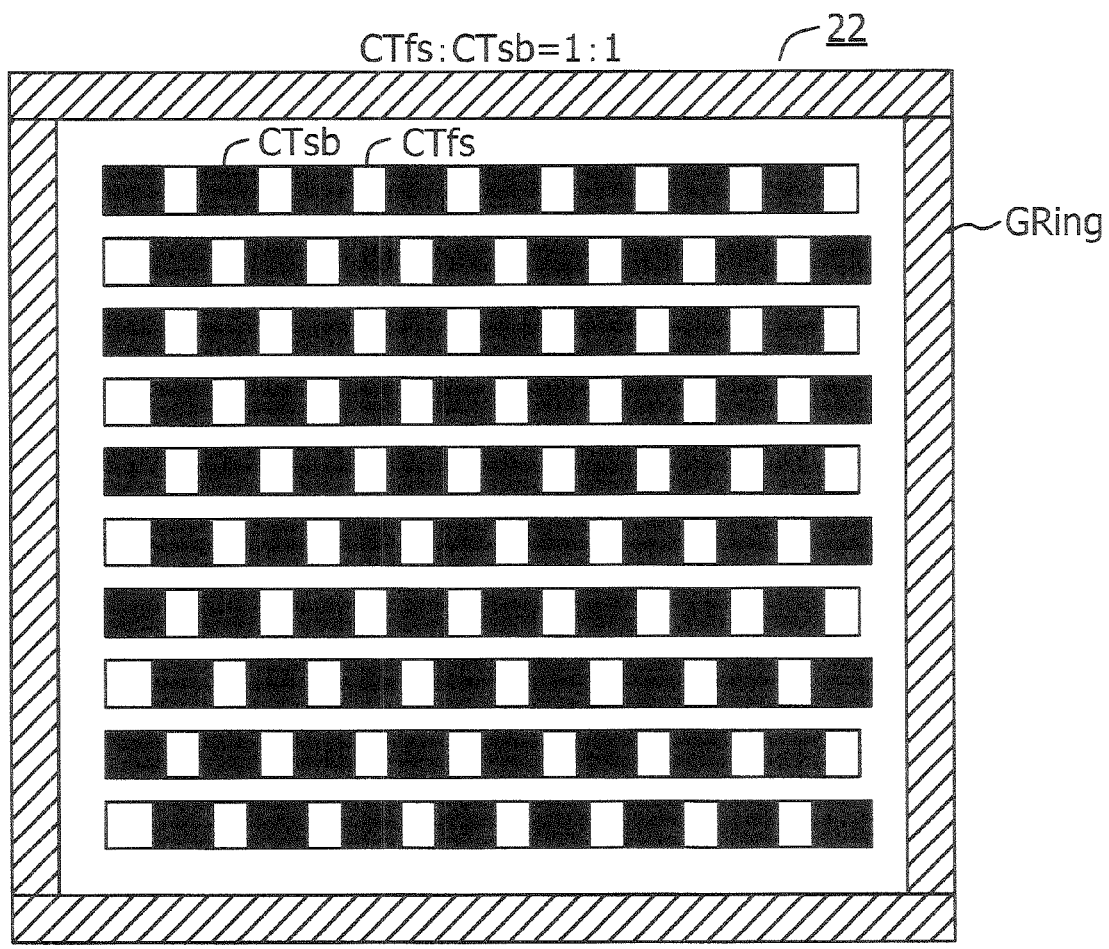
FIG. 6 is a plain view illustrating an area over which the first clamp transistor in FIG. 5B is formed.

FIG. 6 is a plain view illustrating the forming region of the first clamp transistors according to this embodiment. In this example, 16×10=160 clamp transistors are made up of the first clamp transistors CTfs (full silicide) and the second clamp transistors CTsb (with silicide blocks) with a ratio of approximately 1:1 and are disposed in a distributed manner.

As described above, it was found that the second clamp transistors CTsb with silicide blocks stably perform multi-finger turn-on, which subsequently induces turn-on of all the first clamp transistors CTfs together. In particular, it is effective to dispose the second clamp transistors CTsb so as to be distributed throughout the first clamp transistor group. The size of one second clamp transistor CTsb is approximately twice as large as that of one first clamp transistor CTfs. Thus, the area may be reduced by 75% compared with when the power supply clamp circuit is configured only with the second clamp transistors CTsb.

Figure 7:
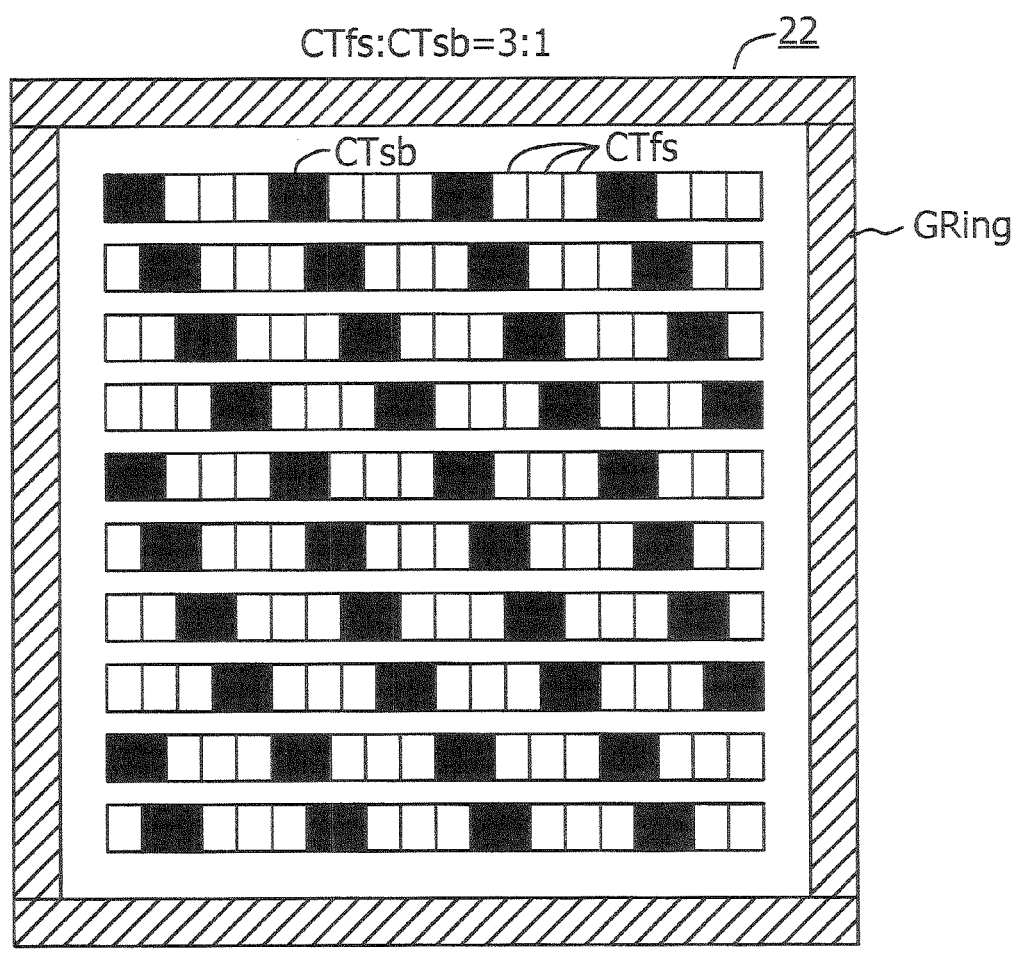
FIG. 7 is a plain view illustrating an area over which the second clamp transistor in FIG. 5A is formed.

FIG. 7 is a plain view of the forming region of the second clamp transistors according to this embodiment. In this example, 16×10=160 clamp transistors are made up of the first clamp transistors CTfs (full silicide) and the second clamp transistors CTsb (with silicide block) with a ratio of approximately 3:1 and are disposed in a distributed manner. In this case, a high voltage surge stably turns on the first clamp transistors and the second clamp transistors together and the surge current may be absorbed as will be described later. This example is more effective in reducing the area compared with the example in FIG. 6.

However, increasing the ratio of the first clamp transistors CTfs larger than 3:1 makes it difficult to achieve stable turn-on operation for a high voltage surge.

Figure 8:
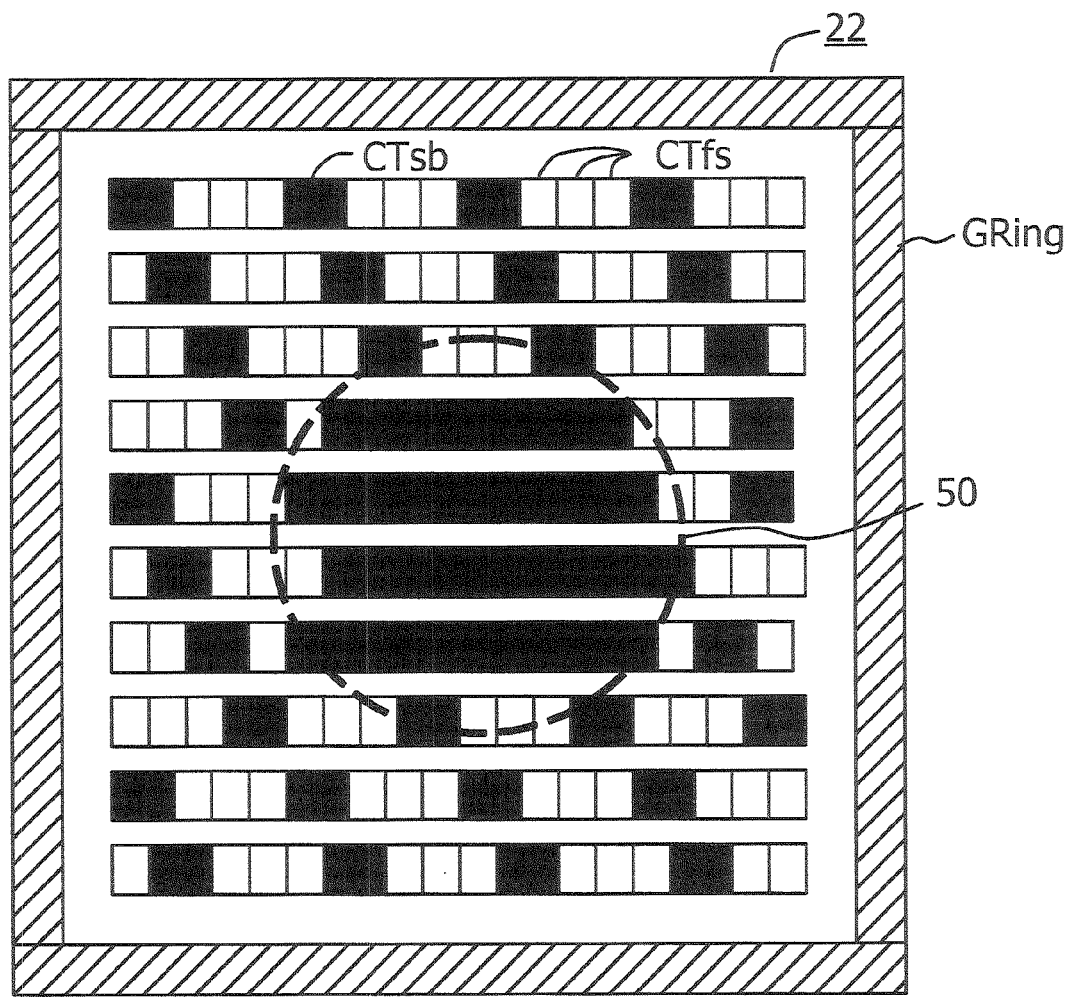
FIG. 8 is a plain view illustrating an area over which the third clamp transistor is formed.

FIG. 8 is a plain view illustrating an area of a third clamp transistor forming region. In this example, 16×10=160 clamp transistors are made up of the first clamp transistors CTfs (full silicide) and the second clamp transistors CTsb (with silicide blocks) with a ratio of approximately 3:1 and disposed in a distributed manner. Moreover, in a central region 50 which is far away from the guard ring region GRing, mostly the second clamp transistors CTsb (with silicide blocks) are adjacently disposed. Outside of the central region 50, as described the above, the first clamp transistors and the second clamp transistors are arranged with a ratio of approximately 3:1 in a distributed manner.

As illustrated in FIG. 8, it was found that disposing the second clamp transistors CTsb with silicide blocks adjacently in the central region which is far from the guard ring region achieves more stable turn-on operation. As described above, in the central region 50 that is the far from the guard ring region GRing, the resistance of the substrate from the ground that is coupled to the guard ring region tends to be higher, the base potential of the parasitic bipolar transistor tends to be higher as well, and the bipolar transistors turn on faster than other regions. Therefore, it is considered that disposing the second clamp transistors CTsb with silicide blocks adjacently in the central region 50 may further improve turn-on operation. This layout stably absorbed a surge current even with a high surge voltage in a C-V method latch-up test. Thus, it is expected that the ratio of the second clamp transistors may be reduced by adjacently disposing the second clamp transistors in the central region.

Figure 9:
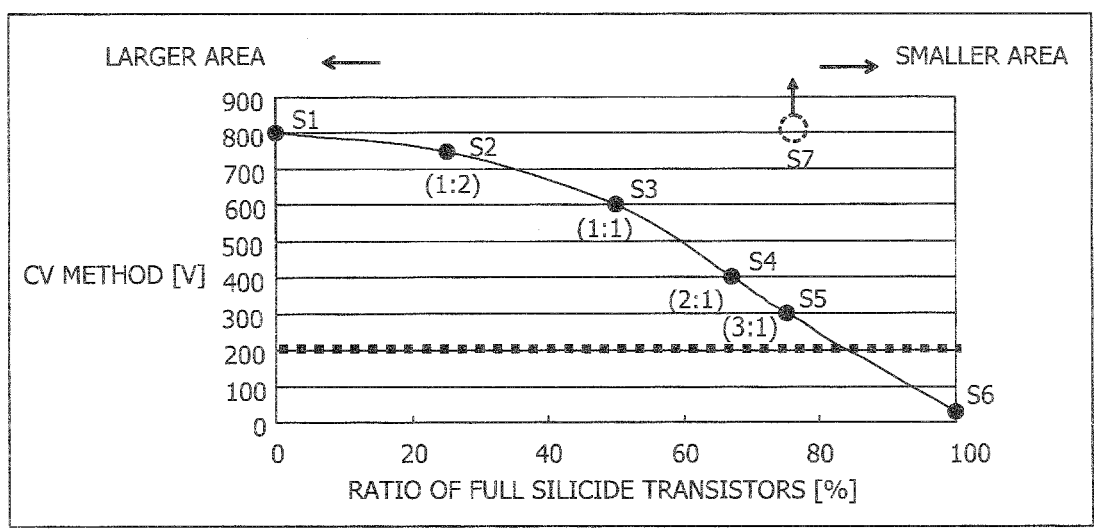
FIG. 9 illustrates a first result of a latch-up test of C-V method for the power supply clamp circuit in FIG. 1.

FIG. 9 illustrates results of a C-V method latch-up test for the power supply clamp circuit according to this embodiment. The C-V method latch-up test is used to check whether or not the internal circuit is affected when a switch that couples an electrode of a capacitor that is charged to a given voltage and a power supply terminal of an integrated circuit is made conductive while power supply voltage is supplied to the integrated circuit device to be tested. The voltage for the charging voltage source that charges the capacitor is gradually increased to confirm which voltage leads to the destruction (withstanding voltage level). The higher the voltage is, the more immune the withstanding voltage level is for power source noise. As illustrated by the dotted line in FIG. 9, around 200V is a desirable minimum tolerance level.

The horizontal axis in FIG. 9 indicates the ratio of the first clamp transistors (full silicide) (%), while the vertical axis indicates the charging voltage that leads to the destruction. In FIG. 9, the areas of the clamp transistor region are smaller toward the right side of the horizontal axis, and the areas of the clamp transistor region are larger toward the left side of the horizontal axis. Thus, in order to save space, a ratio of the first clamp transistors (full silicide) should be increased as much as possible. However this conversely makes turn-on operation less stable and lowers the tolerance level.

FIG. 9 illustrates voltages immediately before the destruction of samples S1 to S6. The sample S1 was configured so that all clamp transistors are the second clamp transistors CTsb with silicide blocks and was not destructed up to a charging voltage 800V. In the sample S2, the ratio of the first clamp transistors CTfs (full silicide) was approximately 33% and was mixed at a ratio of CTfs: CTsb=1:2. For example, as illustrated in FIG. 6, the two kinds of clamp transistors are disposed in a distributed manner.

In the sample S3, the ratio of the first clamp transistors CTfs (full silicide) was approximately 50%, and was mixed at a ratio of CTfs:CTsb=1:1. In other words, the two kinds of clamp transistors in FIG. 6 were mixed with a ratio of 1:1, and disposed in a distributed manner. In this case, the sample S3 was not destructed up to 600 V.

In the sample S4, the ratio of the first clamp transistors CTfs (full silicide) was approximately 66%, mixed at a ratio of CTfs:CTsb=2:1, and disposed in a distributed manner. In this case, the sample S4 was not destructed up to 400 V. In the sample S5, the ratio of the first clamp transistors CTfs (full silicide) was approximately 75%, mixed at a ratio of CTfs: CTsb=3:1, and disposed in a distributed manner. In other words, this applies to the example of FIG. 7. The withstanding voltage level of this sample 5 was approximately 300 V, and higher than the desired level of 200 V.

The sample S6 is an example of a configuration in which all clamp transistors were the first clamp transistors CTfs. In this sample, all clamp transistors were not turned on, but only some of the clamp transistors were turned on, which resulted in the destruction of the sample S6.

It may be understood from the test results in FIG. 9 that a desirable ratio of the first clamp transistors CTfs and the second clamp transistors CTsb is within a range of 1:2 to 3:1. Although reducing the ratio of the second clamp transistors CTsb reduces the occupied area, the withstanding voltage level is lower. On the other hand, increasing the ratio of the second clamp transistors CTsb increases the withstanding voltage level, however the area becomes larger.

The sample S7 is an example of a configuration in which the first clamp transistors CTfs and the second clamp transistors CTsb were mixed at a ratio of CTfs: CTsb=3:1 and disposed in a distributed manner. Moreover, the clamp transistors were formed in the P well region in a deep Nwell structure. As will be described later, in this case, the withstanding voltage level is substantially improved. The arrow of sample S7 in FIG. 9 indicates that since the C-V method test is performed up to 800 V and not performed for voltages higher than 800 V, the test was not completed even though it may be assumed that the charging voltage level may have gone above 800 V without destructing the sample 7.

Figure 10:
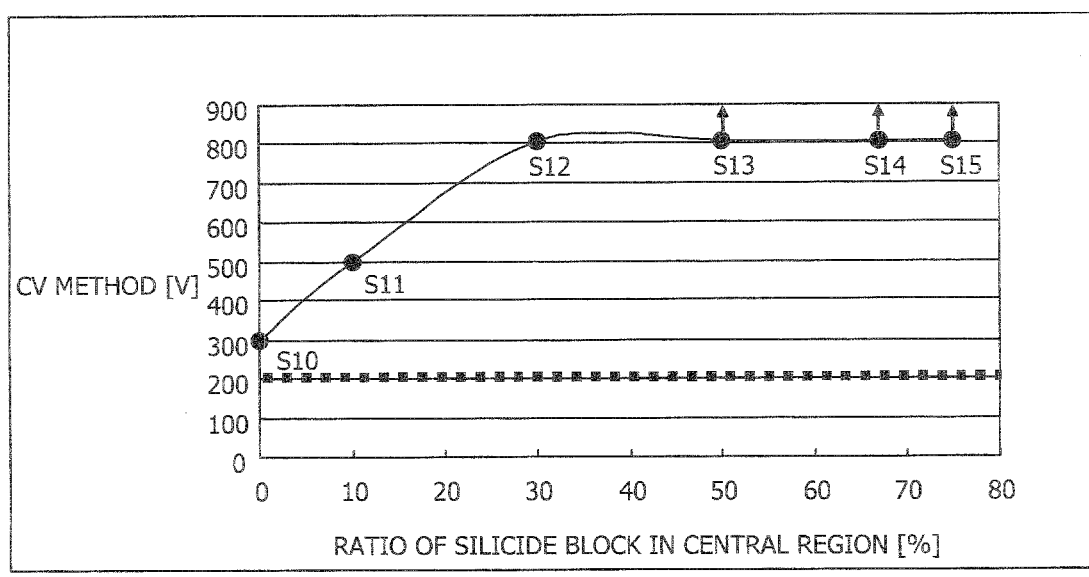
FIG. 10 illustrates a second result of a latch-up test of C-V method for the power supply clamp circuit in FIG. 1.

FIG. 10 illustrates results of a C-V method latch up test for the power supply clamp circuit according to this embodiment. The test results are for samples S10 to S15 for which the first and the second clamp transistors are mixed with a ratio of CTfs: CTsb=3:1 and each of the samples includes various ratios of the second clamp transistors CTfs adjacently disposed within the central region 50. The horizontal axis indicates ratio of the number of the second clamp transistors CTsb adjacently disposed in the central region 50.

The ratio of the central region of the sample S10 is 0%, which is the same ratio as the ratio of the sample S5 in FIG. 9. Therefore, the withstanding voltage level was the same 300 V. The ratio of the second clamp transistors CTsb adjacently disposed in the central region 50 was 10% for sample S11, 30% for sample S12, 50% for sample S13, 66% for sample S14, and 75% for sample S15. As the sample S11 and the sample S12 indicate, increasing the ratio of the second clamp transistors CTsb in the central region 50 raises the withstanding voltage levels of the sample S11 from 300 V to 500 V to 800 V. The withstanding voltages for samples S12, 514, and S15 were confirmed up to 800 V. However, the test could not be performed for a charging voltage that exceeds 800 V, and the test was performed only up to 800 V.

It may be understood from the test results in FIG. 10, even if a ratio of the second clamp transistors CTsb (with silicide blocks) is as low as CTfs: CTsb=3:1, by adjacently disposing the second clamp transistors CTsb in the central region, substantially simultaneous turn-on operations are further stabilized, and the withstanding voltage level increases.

Figure 11:
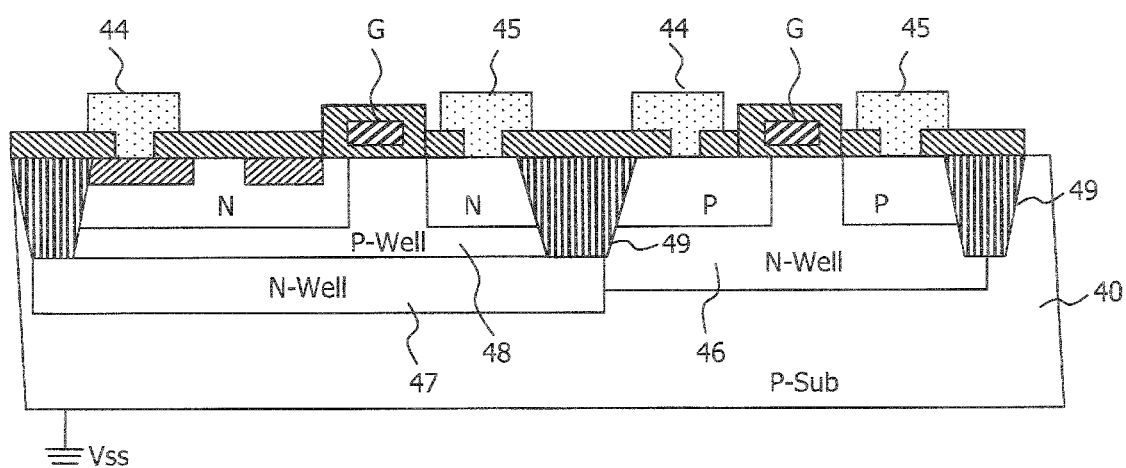
FIG. 11 illustrates a deep Nwell structure that may be applied to the clamp transistor in FIG. 1.

FIG. 11 is a sectional view of a clamp transistor with a deep Nwell structure. In this example, at one side of the clamp transistor, an N-type well region 46 is formed in a P-type silicon substrate P-Sub, and P-type drain and source regions are formed in the N-type well region 46 to form a P-channel MOS transistor. Moreover, at the other side of the clamp transistor, an embedded N-type well region 47 and a shallow trench isolation (STI) structure 49 form a P-type well region 48 that is isolated from the P-type substrate P-Sub and N-type drain, and source regions are formed in the P-type well region 48 to form an N-channel MOS transistor.

This deep Nwell structure allows for isolation of the P-type well region 48 where the N-channel MOS transistor is to be formed from the P-type substrate P-Sub. A base potential of NPN parasitic bipolar transistors in lateral direction may be further raised when a voltage surge is applied, and easy turn-on may be achieved.

The sample S7 in FIG. 9 is an example in which an N-channel MOS transistor with a deep Nwell structure illustrated in FIG. 11 is used as a clamp transistor. The deep Nwell structure allows for an increase of the withstanding voltage.

As described above, according to the power supply clamp circuit of this embodiment, a surge current may be conducted by reducing the clamp transistor unit area and stably turning on a plurality of clamp transistor units when a voltage surge is applied.

According to the above described embodiment, the internal circuit may be protected when a C-V method latch-up test is conducted.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A power supply clamp circuit comprising:
a first transistor including a metal silicide layer that is formed in a substrate between a first electrode coupling part in a first drain region and a first gate electrode; and
a second transistor including a first metal silicide layer and a second metal silicide layer each of which is formed in a substrate between a second electrode coupling part in a second drain region and a second gate electrode,
wherein the first metal silicide layer and the second metal silicide layer are spaced apart from each other.

2. The power supply clamp circuit according to claim 1, wherein the first transistor and the second transistor are serially coupled between a first power supply wiring and a second power supply wiring.

3. The power supply clamp circuit according to claim 1, wherein the first drain region and the second drain region are formed in a second conductivity type formed in a first conductivity type region.

4. The power supply clamp circuit according to claim 2, wherein the first transistor and the second transistor are formed in a clamp transistor forming region in a distributed manner.

5. The power supply clamp circuit according to claim 4, wherein a plurality of the first transistors and a plurality of the second transistors are provided;
wherein the clamp transistor forming region is surrounded by a guard ring region:
wherein a part of the plurality of the second transistors are adjacently disposed in a central region of the clamp transistor forming region, and the plurality of the first transistors and the remaining second transistors are disposed in a region other than the central region in a distributed manner.

6. The power supply clamp circuit according to claim 4, wherein a mixed ratio of the first transistors and the second transistors is in a range of 1:2 to 3:1.

7. The power supply clamp circuit according to claim 1 further comprising:
a first power supply wiring that is coupled to the plurality of the first transistors and a second power supply wiring that is coupled to the plurality of the second transistors; and
a timer circuit that is coupled to the first power supply wiring and the second power supply wiring, and when a high voltage surge is applied between the first power supply wiring and the second power supply wiring, the timer circuit outputs a signal corresponding to a voltage of the first power supply wiring after outputting a signal corresponding to a voltage of the second power supply wiring; and
an inverter to which the output of the timer circuit is input and the output of the inverter is coupled to the first gate electrode and the second gate electrode.

8. The power supply clamp circuit according to claim 2, wherein the first conductivity type region of the second transistor is a region isolated by a well region of the second conductivity type.

9. The power supply clamp circuit according to claim 7, wherein the first conductivity type region is coupled to the second power supply wiring.

10. The power supply clamp circuit according to claim 1, wherein a region between the first metal silicide layer and the second metal silicide layer functions as a silicide block region, and the silicide block region is substantially parallel to the longitudinal direction of the second gate electrode.

* * * * *